US008558777B2

(12) United States Patent
Jang et al.

(10) Patent No.: US 8,558,777 B2
(45) Date of Patent: Oct. 15, 2013

(54) METHOD OF DRIVING SHIFT REGISTER, GATE DRIVER, AND DISPLAY DEVICE HAVING THE SAME

(75) Inventors: Yong Ho Jang, Kyungki (KR); Binn Kim, Seoul (KR); Hyung Nyuck Cho, Incheon (KR)

(73) Assignee: LG Display Co., Ltd., Seoul (KR)

( * ) Notice: Subject to any disclaimer, the term of this patent is extended or adjusted under 35 U.S.C. 154(b) by 1566 days.

(21) Appl. No.: 11/304,532

(22) Filed: Dec. 16, 2005

(65) Prior Publication Data

US 2006/0227093 A1 Oct. 12, 2006

(30) Foreign Application Priority Data

Apr. 11, 2005 (KR) .......................... 10-2005-029839

(51) Int. Cl.
*G09G 3/36* (2006.01)
*G11C 19/00* (2006.01)

(52) U.S. Cl.
USPC ................. 345/100; 345/99; 377/64; 377/70; 377/75

(58) Field of Classification Search
USPC .................... 345/98, 100, 211–213; 315/160, 315/167–169.4; 377/57–81, 154; 365/78, 365/93, 189.11–189.12, 240; 324/62
See application file for complete search history.

(56) References Cited

U.S. PATENT DOCUMENTS

| | | | | |
|---|---|---|---|---|
| 5,701,136 | A | 12/1997 | Huq et al. | |
| 2001/0022573 | A1* | 9/2001 | Sasaki et al. | 345/100 |
| 2003/0002615 | A1* | 1/2003 | Morosawa et al. | 377/64 |
| 2004/0174334 | A1* | 9/2004 | Washio et al. | 345/102 |

FOREIGN PATENT DOCUMENTS

| | | |
|---|---|---|
| KR | 10-0391729 | 7/2003 |

* cited by examiner

*Primary Examiner* — Jonathan Horner
(74) *Attorney, Agent, or Firm* — Morgan, Lewis & Bockius LLP

(57) ABSTRACT

A gate driver, comprises a plurality of shift registers configured to output signals sequentially such that an Nth shift register is reset by an output signal of an (N+2)th shift register, wherein last, second last and third last shift registers are reset by a last output signal of the last shift register.

10 Claims, 8 Drawing Sheets

STV VDD C1 M7 M8 Q M2 GOUT1 M5 M4 QB M3 SRC2 M9 M1 GOUT3 VSS

METHOD OF DRIVING SHIFT REGISTER, GATE DRIVER, AND DISPLAY DEVICE HAVING THE SAME

This application claims the benefit of the Korean Patent Application No. 2005-029839 filed on Apr. 11, 2005, which is hereby incorporated by reference.

BACKGROUND OF THE INVENTION

1. Field of the Invention

The present invention relates to a shift register, and more particularly, to a method of driving a shift register, a gate driver, and a display device having the same with greater reliability.

2. Discussion of the Related Art

A display device for displaying an image by controlling the pixels arranged in a matrix has been widely used. Examples of the display devices are a liquid crystal display (LCD) device, an organic light emitting diode (OLED) device, etc. Such a display device includes a display panel having the pixels arranged in a matrix, a gate driver for scanning pixels line by line, and a data driver for supplying an image data.

Recently, a display device having a gate driver and/or a data driver embedded on a display panel has been actively developed to achieve simplified fabricating process, light weight and slim size. In addition, such an embedded display panel can reduce manufacturing cost. When manufacturing the display panel, the gate diver and/or the data driver can be manufactured at the same time. That is, when a plurality of thin film transistors (TFTs) are manufactured, the gate driver and/or the data driver can be manufactured through the identical semiconductor processes used in the TFT. Each of the drivers includes a plurality of shift registers for outputting signals. For example, when the display panel has ten gate lines, ten shift registers are provided to supply their signals to the ten gate lines, respectively.

FIG. 1 is a block diagram of a related art gate driver. Referring to FIG. 1, the related art gate driver includes a plurality of shift registers SRC1 to SRC[N+1] connected in a cascaded manner. An output terminal OUT of each shift register is connected to a set terminal SET of the next shift register. The shift registers include n number of shift registers SRC1 to SRC[N] corresponding to n number of gate lines, and a dummy shift register SRC[N+1] for resetting the last shift register SRC[N].

The first shift register SRC1 is set by a pulse start signal STV. The pulse start signal is a pulse synchronized with a vertical synchronizing signal Vsync. Each of the shift registers SR2 to SRC[N+1] is set by an output signal of its previous shift register. When there are n number of the gate lines, signals GOUT1 to GOUT[N] of the shift registers are connected to the corresponding gate lines, and an output signal GOUT[N+1] of the dummy shift register SRC[N+1] is not connected to any gate line.

A first clock CKV is supplied to the odd-numbered shift registers SRC1, SRC3, etc., and a second clock CKVB is supplied to the even-numbered shift registers SRC2, SRC4 etc. Here, a phase of the first clock CKV is opposite to that of the second clock CKVB. The first clock CKV is simultaneously applied to the odd-numbered shift registers SRC1, SRC3, etc., and the second clock CKVB is simultaneously applied to the even-numbered shift registers SRC2, SRC4, etc.

The timing when a pulse start signal STV is applied to the first shift register SRC1 is when the second clock CKVB is high. The shift registers SRC1 to SRC[N] output the respective signals GOUT1 to GOUT[N] in synchronization with the first clock CKV and the second clock CKVB. And, each of the shift registers SRC1 to SRC[N] except the dummy shift register SRC[N+1] is reset by the output signal of its subsequent shift register.

As explained above, each of the shift registers SRC1 to SRC[N] produces the output signal in synchronization with the first and second clocks CKV and CKVB. And, each shift register SRC1 to SRC[N] is set by the output signal of its previous shift register. The reset signal is the output signal of subsequent shift register to the current one which is provided to corresponding shift register SRC1 to SRC[N]. However, since there is no shift register provided next to the dummy shift register SRC[N+1], the dummy shift register SRC[N+1] is reset by its own output signal GOUT[N+1].

FIG. 2 is a circuit diagram of a first shift register illustrated in FIG. 1. FIG. 3 is a waveform diagram of multiple signals for driving the first shift register of FIG. 2. Since the shift registers illustrated in FIG. 1 have the identical structure to one another, only the first shift register SRC1 will be described for convenience.

When the pulse start signal STV is high, the first clock CKV is low and the second clock CKVB is high. Referring to FIGS. 2 and 3, the first shift register SRC1 is set by the pulse start signal STV of a high state during a second clock (CKVB) period. That is, when the pulse start signal STV is applied, a Q node is charged to a voltage of the pulse start signal STV. A first transistor M1 is turned on by the charged Q node. Then, a QB node is discharged by a voltage difference (VDD−VSS) between a first power supply voltage and a second power supply voltage. Consequently, a low voltage is maintained by a ratio of a resistance R1 of a first transistor M1 to a resistance R6 of a sixth transistor M6.

Then during a subsequent clock period when a first clock CKV is high, a first output signal GOUT1 is output in response to the first clock CKV. That is, when the first clock CKV is applied to the second transistor M2, a bootstrapping is caused by a drain-gate capacitance Cgd in a second transistor M2, and thus, the Q node is charged with a voltage higher than that of the charged pulse start signal STV. Accordingly, the second transistor M2 is turned on, and thus, the first clock CKV is output as the first output signal GOUT1.

During the next clock period when the second clock (CKVB) is high, the first shift register SRC1 is reset by the second output signal GOUT2 of its subsequent shift register SRC2. That is, when a fifth transistor M5 is turned on by the second output signal GOUT2 of the shift register SRC2, the Q node is discharged by a first power supply voltage VSS passing through the fifth transistor M5. Additionally, the first transistor M1 is turned off by the discharged Q node, and the QB node is charged with the second supply voltage VDD passing through the sixth transistor M6, so that third and fourth transistors M3 and M4 are turned on by the charged QB node. Accordingly, the Q node is easily discharged by the first supply voltage VSS passing through the turned-on fourth transistor M4. In this case, most of the output signal GOUT1 is discharged through a source-drain path of the second transistor M2, and the remaining output signal GOUT1 is discharged through the first power supply voltage VSS by the turned-on third transistor M3.

Since the other shift registers SRC2 to SRC[N] operate in the same way as the first shift register SRC1, the signals GOUT1 to GOUT[N] of a high state are output sequentially. The signals GOUT1 to GOUT[N] of a high state are sequentially output during one frame by the shift registers SRC1 to SRC[N]. Then, these processes are repeated frame by frame. However, when the first shift register SRC1 is reset by the second output signal GOUT2 of the second shift register SRC2, the first output signal GOUT1 of the first shift register SRC1 is not discharged easily to a low state.

Generally, the first output signal of a high state is more easily discharged to a low state through the second transistor M2 rather than the third transistor M3. However, since the second transistor M2 is in the turned-off state, it is difficult to discharge the first output signal GOUT1 through the second transistor M2. Thus, the first output signal GOUT1 cannot be discharged quickly. As mentioned earlier, the first output signal GOUT1 is supplied to a first gate line connected to a pixel. When the first output signal Gout1 can not be discharged easily, then the thin film transistor (TFT) provided on the pixel cannot be turned off. Therefore, when a TFT connected to a second gate line is turned on by the second output signal GOUT2 supplied to the second gate line, a data signal supplied to the pixel connected to the second gate line is also supplied to the pixel connected to the first gate line. Consequently, the signals are not discharged fast enough to display an image properly, causing image deterioration.

FIG. 4 is a graph showing the output signal falling time in the shift register provided for the related art gate driver of FIG. 1, which is superimposed with a single clock period. As described above, an output signal of a high state has to be discharged to become the output signal of a low state within the single clock period. However, as shown in FIG. 4, the output signal cannot be completely discharged to a low state at a time when the single clock period is finished.

Referring to FIG. 2, the Q node is reset by the second output signal GOUT2 of the second shift register SRC2. Since the second transistor M2 connected to the Q node is turned off, the first output signal GOUT1 of a high state is not discharged rapidly. Thus, the first output signal GOUT1 of the first shift register SRC1 overlaps an output signal of another shift register (e.g. a second shift register SRC2). Accordingly, it is difficult to control the signals accurately. When the signals are supplied to the LCD, an identical image is displayed on adjacent gate lines and therefore the image failure is caused.

SUMMARY OF THE INVENTION

Accordingly, the present invention is directed to a method of driving a shift register, a gate driver, and a display device having the same that substantially obviate one or more problems due to limitations and disadvantages of the related art.

An object of the present invention is to provide a method of driving a shift register capable of improving reliability of a gate driver and a display device.

Additional features and advantages of the invention will be set forth in the description which follows, and in part will be apparent from the description, or may be learned by practice of the invention. The objectives and other advantages of the invention will be realized and attained by the structure particularly pointed in the written description and claims hereof as well as the appended drawings.

To achieve these and other advantages and in accordance with the purpose of the present invention, as embodied and broadly described, the method of driving a shift register, a gate driver, and a display device having the same includes a gate driver, which comprises a plurality of shift registers configured to output signals sequentially such that an Nth shift register is reset by an output signal of an (N+2)th shift register.

In another aspect, the method of driving a shift register in a gate driver comprises a plurality of shift registers configured to output signals in sequence includes charging a node with an (N−1)th output signal of an (N−1)th shift register during a first clock period; outputting an Nth output signal of a high state by the charged node during a second clock period; discharging the Nth output signal of a high state to a low state during a third clock period; and discharging the charged node by an (N+2)th output signal of an (N+2)th shift register during a fourth clock period.

In another aspect, the display device having a display panel including pixels arranged in a matrix defined by gate lines and data lines; a gate driver to supply signals corresponding to the gate lines of the display panel; and a data driver to supply an image data to the data lines of the display panel, wherein the gate driver includes a plurality of shift registers configured to output signals in sequence such that an Nth shift register being reset by an (N+2)th output signal of an (N+2)th shift register.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
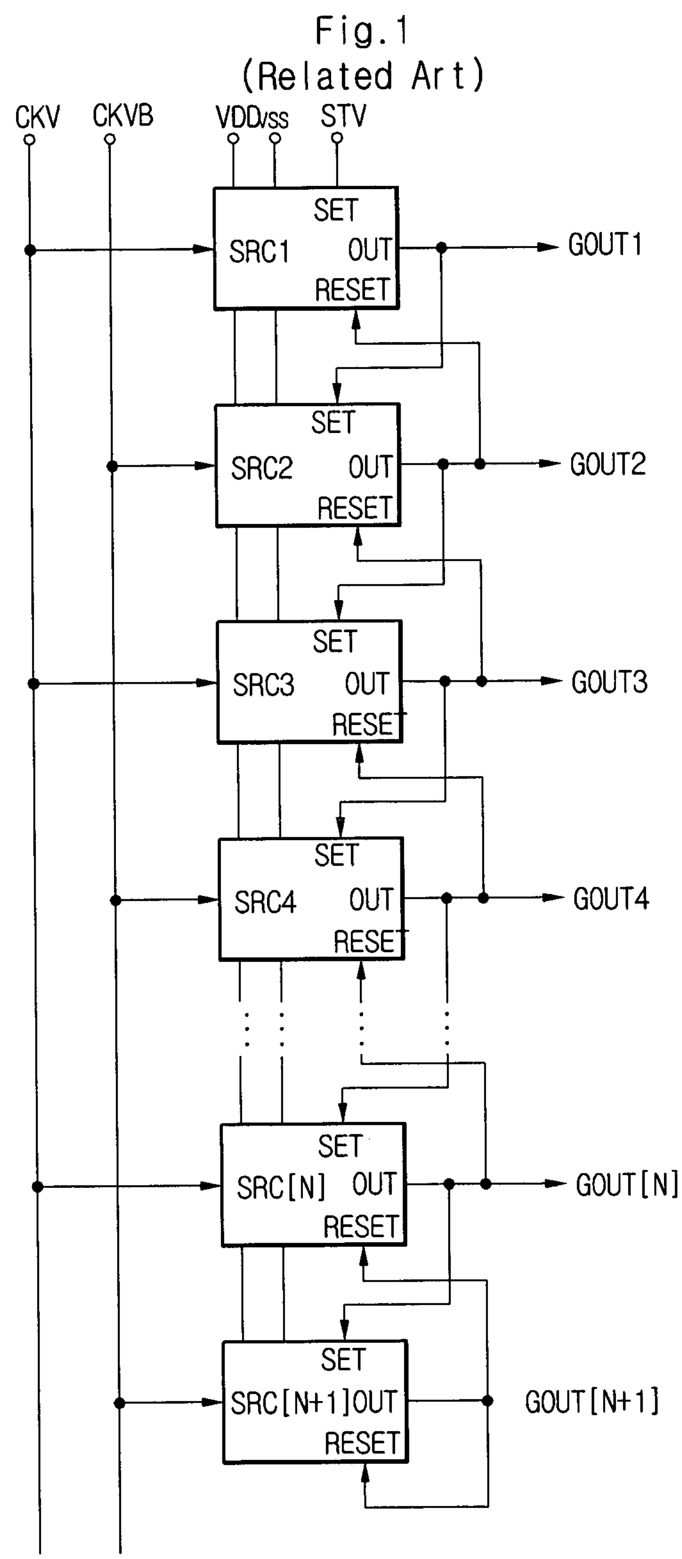
FIG. 1 is a block diagram of a related art gate driver.
Figure 2:
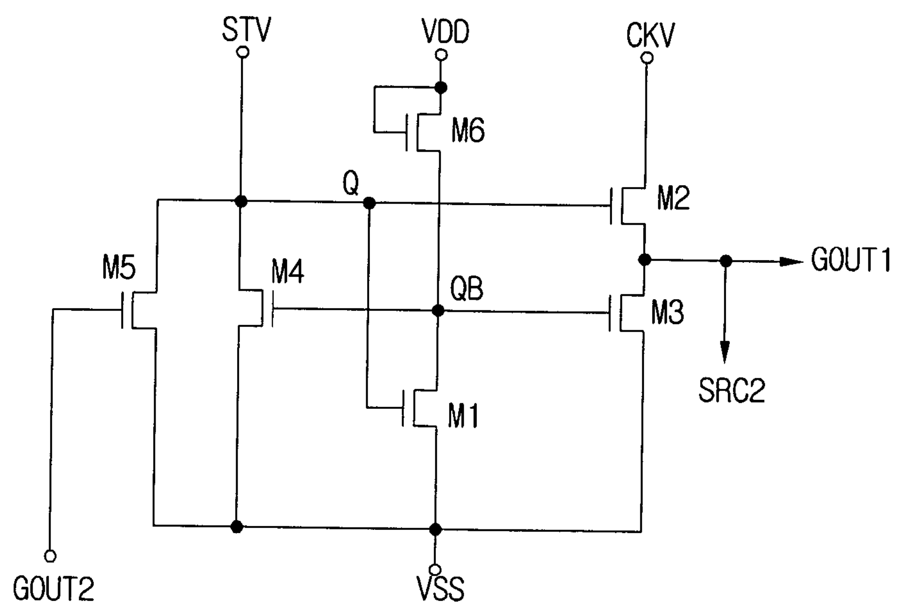
FIG. 2 is a circuit diagram of a first shift register illustrated in FIG. 1.
Figure 3:
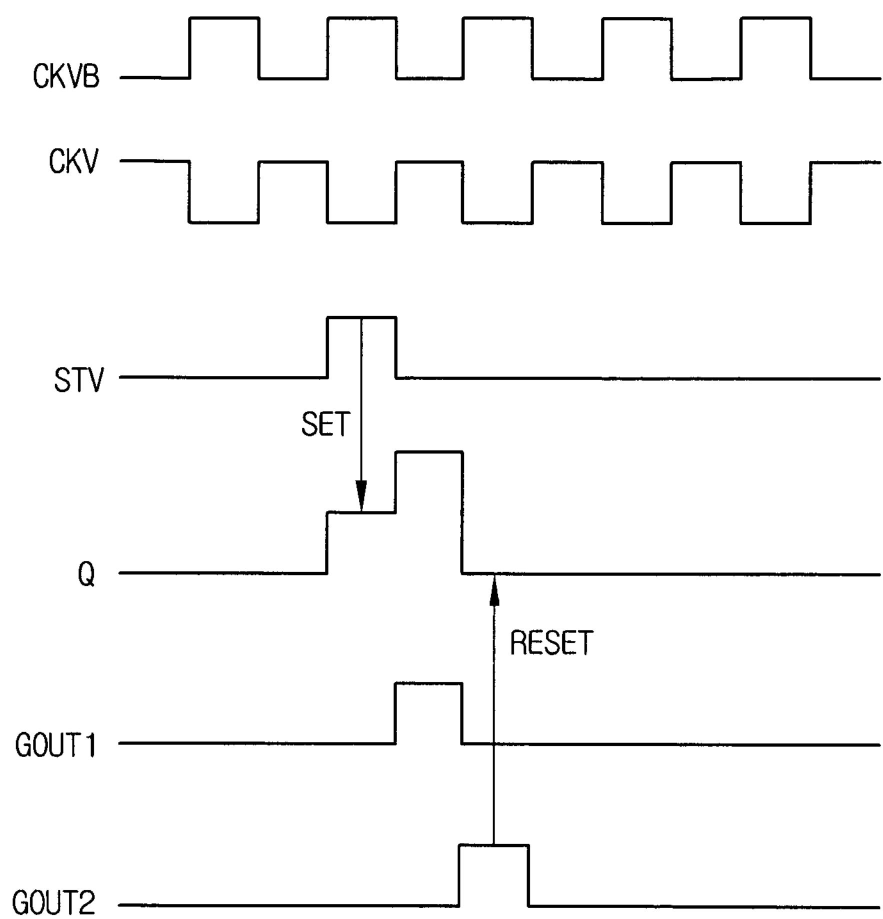
FIG. 3 is a waveform diagram of multiple signals for driving a gate driver of FIG. 1.
Figure 4:
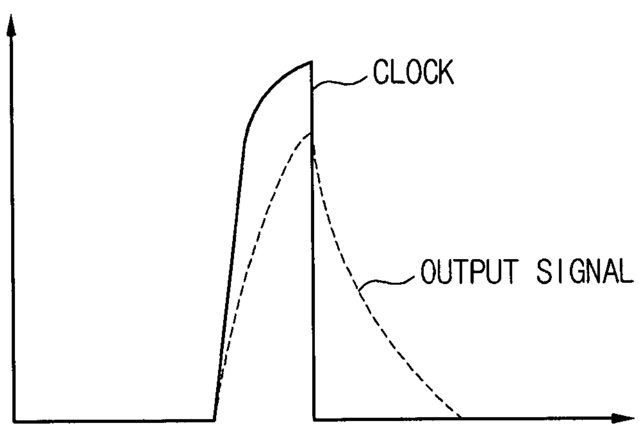
FIG. 4 is a graph showing an output signal falling time in a shift register provided for the related art gate driver of FIG. 1.
Figure 5:
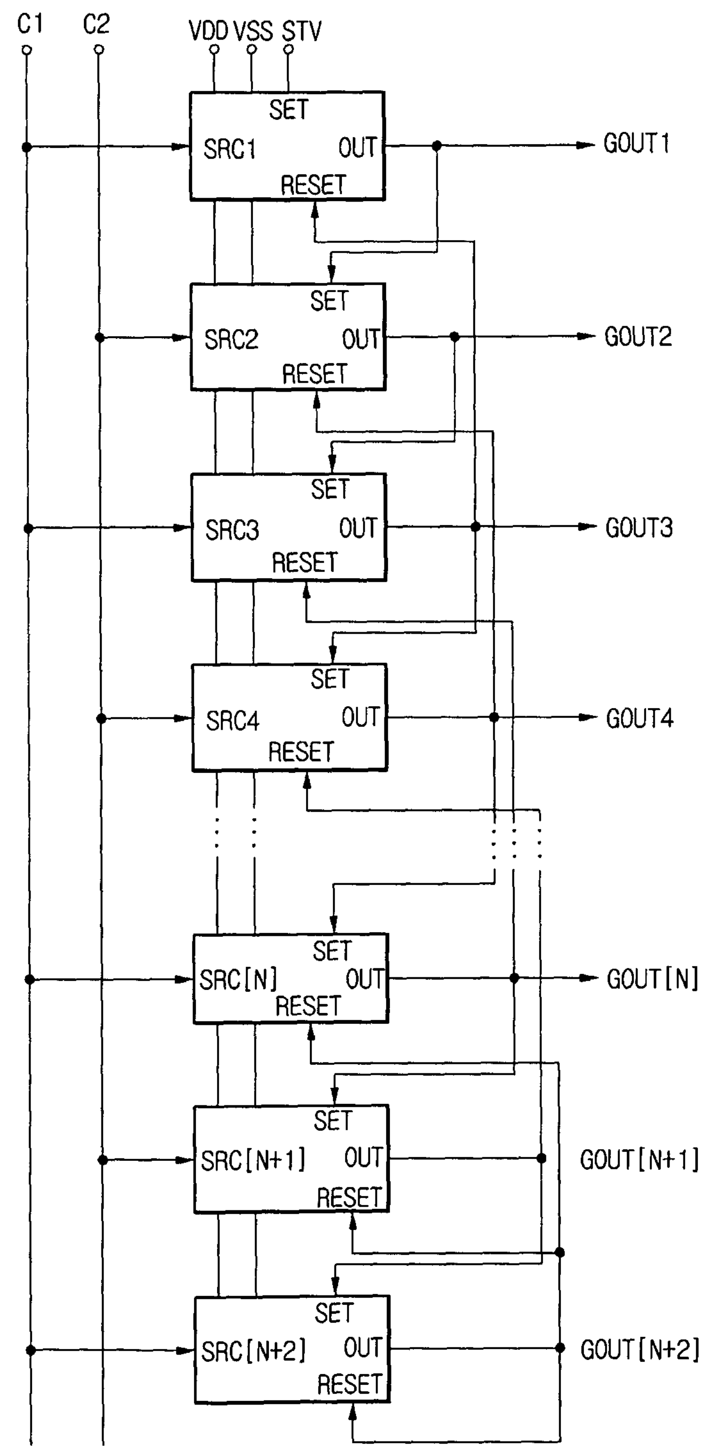
FIG. 5 is a block diagram of a gate driver according to an embodiment of the present invention.

FIG. 5 is a block diagram of a gate driver according to an embodiment of the present invention. Referring to FIG. 5, the gate driver includes n number of shift registers SRC1 to SRC[N] and dummy shift registers SRC[N+1] and SRC[N+2].

A first clock C1 and a second clock C2 is input to the shift registers SRC1 to SRC[N+2]. A first power supply voltage VSS of a low state and a second power supply voltage VDD of a high state are supplied to the shift registers SRC1 to SRC[N+2]. The shift registers SRC1 to SRC[N+2] are connected in cascade manner. That is, the first shift register SRC1 is driven by a pulse start signal STV and outputs a first output signal GOUT1. The second shift register SRC2 is driven by the first output signal GOUT1 and outputs a second output signal GOUT2. Through the same processes, the shift registers SRC3 to SRC[N+2] output respective signals GOUT3 to GOUT[N+2] in sequence. Accordingly, the current shift register can be driven by an output signal of its previous shift register.

Meanwhile, the Nth shift register SRC[N] is reset by an output signal GOUT[N+2] of the (N+2)th shift register SRC [N+2]. That is, the first shift register SRC1 is reset by an output signal GOUT3 of the third shift register SRC3. Similarly, the second shift register SRC2 is reset by an output signal GOUT4 of the fourth shift register SRC4. Through these processes, each of the shift registers is reset by the output signal of the second next shift register following the current one.

Here, one of the first clock C1 and the second clock C2 having opposite phases to each other is input to the shift registers SRC1 to SRC[N+2]. Signals delayed one clock period by one clock period are input to the respective shift registers. For example, as shown in FIG. 5, when the first clock C1 is input to the first shift register SRC1, the second clock C2 is input to the second shift register SRC2, and the first clock C1 is input to the third shift register SRC3. In the same manner, the first clock C1 and the second clock C2 are input to the remaining shift registers SRC4 to SRC[N+2].

The first shift register SRC1 performs no operations during the second clock period in which the second clock C2 is input to the second shift register SRC2. The first clock C1 is input to the third shift register SRC3, and the third output signal GOUT3 is output from the third register SRC3 by the first clock C1. Consequently, the first shift register SRC1 is reset by the third output signal GOUT3. In this case, since the first shift register SRC1 is not reset during the second clock period and provided with enough time to discharge the first output signal GOUT1, the first shift register SRC1 uses the second clock period to discharge the first output signal GOUT1. Consequently, image deterioration due to the signal discharge delay of the related art can be prevented.

More specifically, the first shift register SRC1 is set by a pulse start signal STV and charges a Q node to the voltage level of the second power supply voltage VDD. When the first clock C1 is input to the first shift register SRC1, a voltage of the Q node increases due to bootstrapping and a first output signal of a high state is output by the Q node. The second shift register SRC2 is set by the first output signal GOUT1 and a Q node of the second shift register SRC2 is charged to the voltage level of the second power supply voltage VDD. When a second clock C2 is input to the second shift register SRC2, a voltage of the Q node increases due to the second clock C2, and a second output signal GOUT2 of a high state is output by the Q node.

The third shift register SRC3 is set by the second output signal GOUT2 and a Q node of the third shift register SRC3 is charged to the voltage level of the second power supply voltage VDD. When the first clock C1 is input to the third shift register SRC3, a voltage of the Q node increases due to the first clock C1, and thus, a third output signal GOUT2 of a high state is output by the Q node. Through these processes, fourth to (N+2)th signals GOUT4 to GOUT[N+2] are output from the remaining shift registers SRC4 to SRC[N+2].

When resetting the shift registers, the third output signal GOUT3 is input to the first shift register SRC1 to reset the first shift register SRC1. That is, the Q node of the first shift register SRC1 is discharged to the voltage level of the first power supply voltage VSS. Accordingly, the first shift register SRC1 outputs the first output signal GOUT1 during the second clock period and the Q node is not reset during the second clock period. The first output signal GOUT1 is rapidly discharged to a low state during the third clock period and the first shift register SRC1 is again reset during the fourth clock period.

Through the same operations, the remaining shift registers SRC2 to SRC[N] can rapidly discharge the signals from a high state to a low state during the odd-numbered clock period. However, the dummy shift registers SRC[N+1] and SRC[N+2] have no problems in driving the gate lines on a liquid crystal panel even when the signal falling time is delayed. The (N+1)th shift register SRC[N+1] is reset by the (N+2)th output signal GOUT[N+2] of the (N+2)th shift register SRC[N+2]. The Nth shift register SRC[N] is reset by the (N+2)th output signal GOUT[N+2].

A circuit diagram of the shift register specific to the exemplary embodiment of the present invention will now be described in more detail for more clarity.

Figure 6:
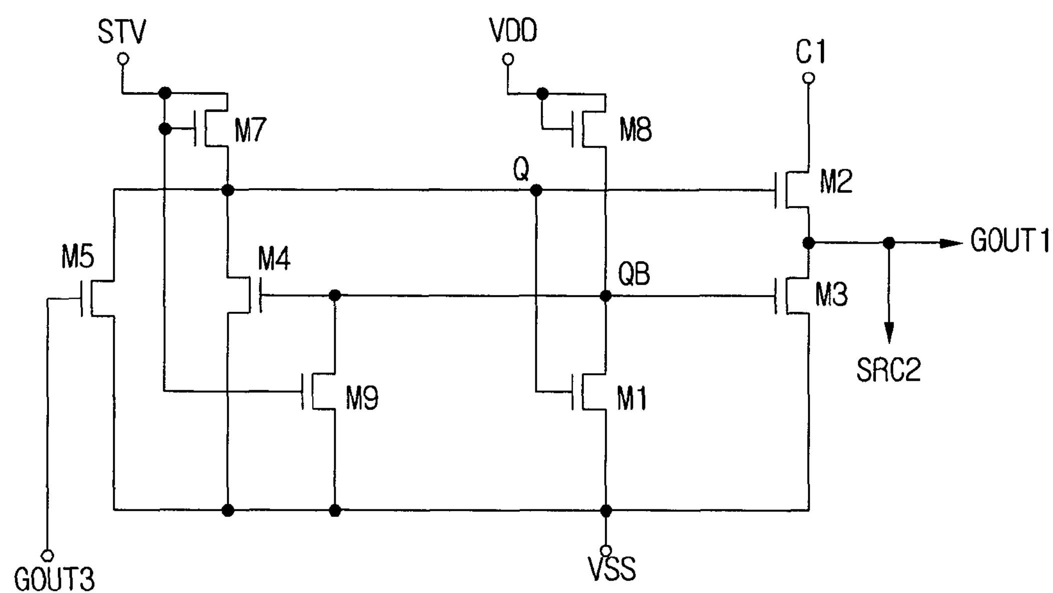
FIG. 6 is a circuit diagram of a first shift register illustrated in FIG. 5.
Figure 7:
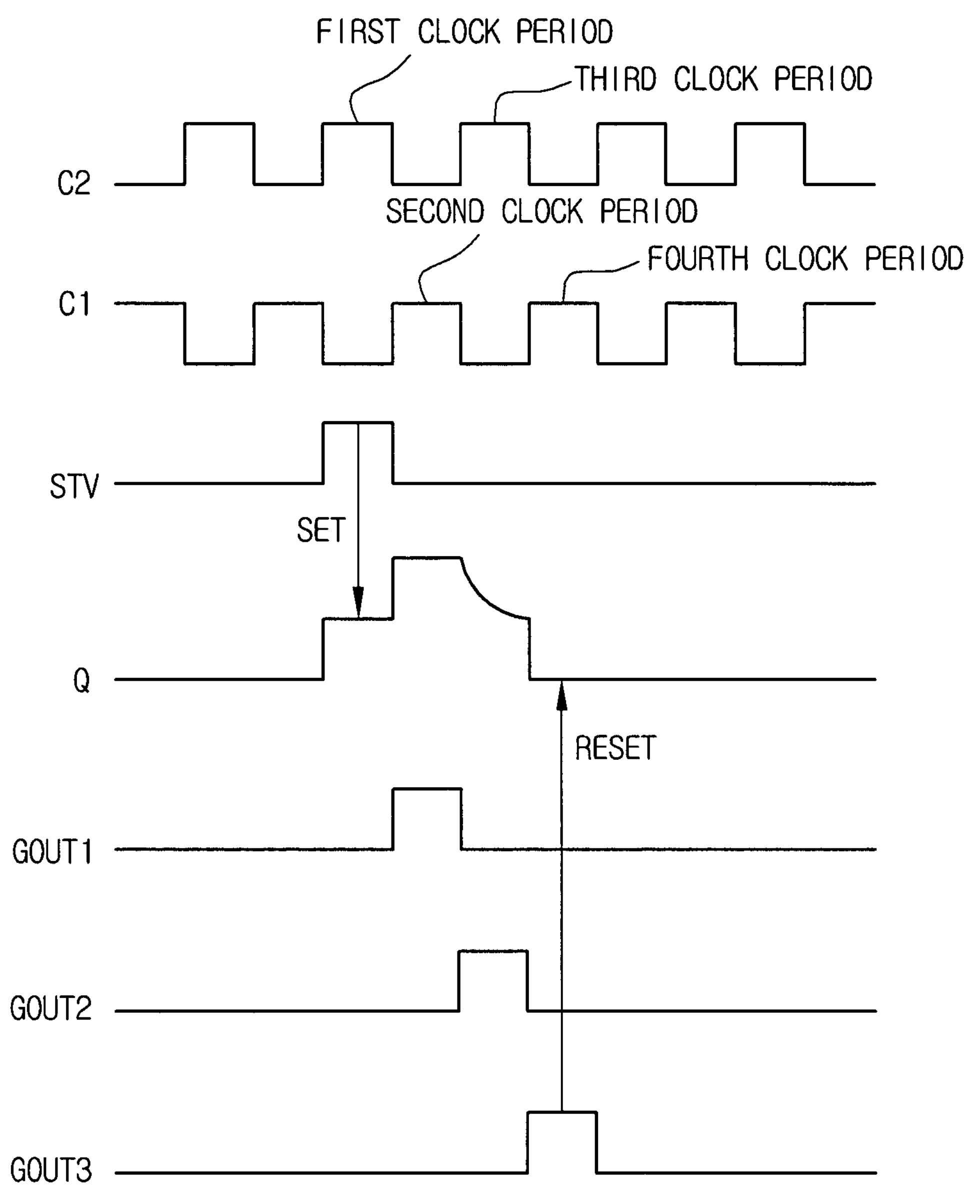
FIG. 7 is a waveform diagram of signals for driving a gate driver of FIG. 5.

FIG. 6 illustrates a circuit diagram of the first shift register illustrated in FIG. 5. FIG. 7 illustrates a waveform diagram of multiple signals for driving the gate driver in FIG. 5. Referring to FIGS. 5 and 6, the first shift register SRC1 is set by the pulse start signal STV of a high state passing through a seventh transistor M7 during the first clock period. That is, when the pulse start signal STV is applied, a Q node is charged to a voltage of the pulse start signal STV. A ninth transistor M9 is turned on in response to the pulse start signal STV and a QB node is discharged to the first power supply voltage VSS through the ninth transistor M9. Additionally, the first transistor M1 is turned on in response to the charged Q node, the QB node is also discharged to the first power supply voltage VSS through the first transistor M1.

However, at the same time while the QB node is discharging through the first transistor M1, the QB node is also charged with a second power supply voltage VDD through an eighth transistor M8. In this case, the QB node has a voltage corresponding to a difference among the first power supply voltage VSS passing through the first transistor M1, the first power supply voltage VSS passing through the ninth transistor M9, and the second power supply voltage VDD passing through the eighth transistor M8. Accordingly, the QB node is maintained at a low state.

The seventh transistor M7 and the eighth transistor M8 prevent a current from flowing in a reverse direction. The seventh transistor M7 and the eighth transistor M8 allow the forward current but inhibit a reverse current.

During the second clock period, the first output signal GOUT1 is output by the first clock C1. That is, when the first clock C1 is applied to the second transistor M2, bootstrapping is caused by a drain-gate capacitance Cgd of the second transistor M2. The Q node is charged with a voltage higher than that of the charged pulse start signal STV. Accordingly, the second transistor M2 is turned on, and thus, the first clock C1 is output as the first output signal GOUT1.

During the third clock period, the first clock C1 is a low state and the pulse start signal STV is a low state. In this case, since the first clock C1 is a low state, the Q node is discharged to the pulse start voltage. Additionally, since the transistor M2 is kept in a turned-on state by a voltage of the Q node, the first output signal of a high state is rapidly discharged to a low state through the second transistor M2.

Additionally, the second output signal GOUT 2 is output from the second shift register SRC2 during the third clock period. During a fourth clock period, the third output signal GOUT3 is output from the third shift register SRC3. At the same time, the third output signal GOUT3 is input to the first shift register SRC1. That is, the fifth transistor M5 is turned on by the third output signal GOUT3 of the third shift register SRC3, and then the Q node is rapidly discharged to the first power supply voltage VSS through the fifth transistor M5. The first transistor M1 is turned on by the discharged Q node, and the QB node is charged with the second power supply voltage VDD. The third transistor M3 and the fourth transistor M4 are turned on by the charged QB node. Accordingly, the Q node is discharged by the first power supply voltage VSS passing through the fourth transistor M4, and the second transistor connected to the Q node is turned off. Additionally, the first output signal GOUT1 is discharged to the first supply voltage VSS passing through the third transistor M3.

Consequently, the first shift register SRC1 is reset by the third output signal GOUT3 of the third shift register SRC3, and the Q node maintains a high state during the previous clock period (e.g. the third clock period). Therefore, the second transistor M2 connected to the Q node is continuously turned on and the first output signal GOUT1 is discharged to a low state through the second transistor M2.

Figure 8:
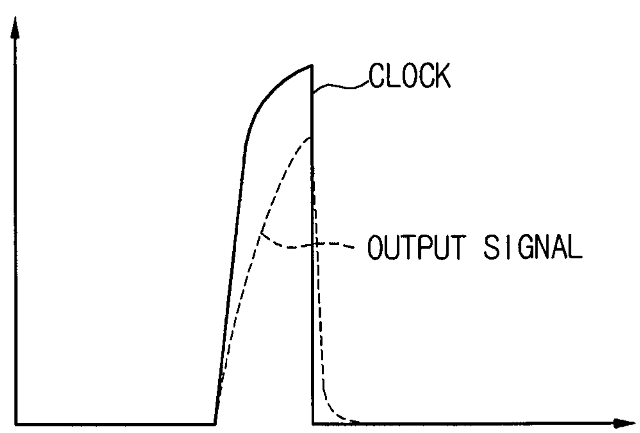
FIG. 8 is a graph of when a falling time of an output signal is reduced in a shift register of the gate driver in FIG. 5.

Referring to FIG. 8, the shift register outputs the output signal of a high state during one clock period. When the clock changes to a low state, the output signal of a high state changes to a low state almost simultaneously. Accordingly, since the corresponding output signal changes from a high stage to a low state in a single clock period, image deterioration due to malfunction in a liquid crystal panel can be resolved by preventing the output signal falling time delay, thus improving the display reliability.

Although the above description has been made only about the two-phase clocks, the present invention is not limited to this. That is, the present invention can also be similarly applied to a multi-phase clock.

As described above, the Nth shift register is reset by the (N+2)th output signal of the (N+2)th shift register. And, the current output signal of a high state is rapidly discharged to a low state. Consequently, the output signal falling time delay induced image deterioration can be resolved.

It will be apparent to those skilled in the art that various modifications and variations can be made in the method of driving a shift register, the gate driver, and the display device having the same of the present invention without departing from the spirit or scope of the invention. Thus, it is intended that the present invention covers the modifications and variations of this invention provided they come within the scope of the appended claims and their equivalents.

What is claimed is:

1. A gate driver, comprising:

a plurality of shift registers configured to output signals sequentially such that a current shift register is reset by an output signal of the shift register after the following shift register, the plurality of shift registers including a plurality of odd-numbered shift registers and a plurality of even-numbered shift registers;

wherein one of a first clock and a second clock having opposite phases is inputted to the plurality of shift registers, wherein the first clock is provided to the odd-numbered shift registers, and the second clock is provided to the even-numbered shift registers, wherein the odd-numbered shift registers are performed to the first clock and the even-numbered shift registers are performed to the second clock, wherein a start time and duration of a high output signal of each of the odd-numbered shift registers is identical with a start time and duration of high period of the first clock, wherein a start time and duration of a high output signal of each of the even-numbered shift registers is identical with a start time and duration of high period of the second clock, and wherein each of the shift registers includes:

a first transistor directly coupled to an output signal of a previous shift register and a first node;

a second transistor directly coupled to the output signal of the previous shift register, a second node and a first power supply voltage;

a third transistor directly coupled to the first node, the second node and the first power supply voltage;

a fourth transistor directly coupled to the second node, the first node and the first power supply voltage;

a fifth transistor directly coupled to the first node and one of clock signals having two or more phases;

a sixth transistor directly coupled to the second node, the fifth transistor and the first power supply voltage; and a seventh transistor directly coupled to an output signal of a shift register after the following shift register, the first node and the first power supply voltage, wherein the current shift register charges a node with the output signal of the previous shift register during a first clock period, outputs an output signal of a high state from the current shift register by the charged node during a second clock period, discharges the output signal of a high state from the current shift register to a low state during a third clock period, and discharges the charged node by the output signal of the shift register after the following shift register during a fourth clock period, wherein the fifth transistor is kept in a turned on state by a voltage of the first node, and the output signal of the high state is rapidly discharged to the low state through the fifth transistor during the third clock period.

2. The gate driver according to claim 1, wherein last, second last and third last shift registers are reset by an output signal of the last shift register.

3. The gate driver according to claim 1, further including a eighth transistor coupled to a second power supply voltage and the second node.

4. The gate driver according to claim 1, wherein an output signal of the current shift register is discharged to a low state when the output signal of the following shift register is output from the following shift register.

5. A method of driving a shift register in a gate driver having a plurality of shift registers configured to output signals in sequence, the plurality of shift registers including a plurality of odd-numbered shift registers and a plurality of even-numbered shift registers, the method comprising:

charging a node with an (N−1)th output signal of an (N−1)th shift register during a first clock period;

outputting an Nth output signal of a high state by the charged node during a second clock period;

discharging the Nth output signal of a high state to a low state during a third clock period; and discharging the charged node by an (N+2)th output signal of an (N+2)th shift register during a fourth clock period, wherein an Nth shift register of the plurality of shift registers is reset by an output signal of the shift register after the following shift register, wherein one of a first clock and a second clock having opposite phases is inputted to the plurality of shift registers, wherein the first clock is provided to the odd-numbered shift registers, and the second clock is provided to the even-numbered shift registers, wherein the odd-numbered shift registers are performed to the first clock and the even-numbered shift registers are performed to the second clock, wherein a start time and duration of a high output signal of each of the odd-numbered shift registers is identical with a start time and duration of high period of the first clock, wherein a start time and duration of an output signal of each of the even-numbered shift registers is identical with a start time and duration of high period of the second clock, and wherein each of the shift registers includes:

a first transistor directly coupled to an output signal of a previous shift register and a first node;

a second transistor directly coupled to the output signal of the previous shift register, a second node and a first power supply voltage;

a third transistor directly coupled to the first node, the second node and the first power supply voltage;

a fourth transistor directly coupled to the second node, the first node and the first power supply voltage;

a fifth transistor directly coupled to the first node and one of clock signals having two or more phases;

a sixth transistor directly coupled to the second node, the fifth transistor and the first power supply voltage; and a seventh transistor directly coupled to an output signal of a shift register after the following shift register, the first node and the first power supply voltage, wherein the fifth transistor is kept in a turned on state by a voltage of the first node, and the output signal of the high state is rapidly discharged to the low state through the fifth transistor during the third clock period.

6. The method according to claim 5, wherein each of the plurality of shift registers outputs an output signal in response to a clock having two or more phases.

7. A display device, comprising:

a display panel including pixels arranged in a matrix defined by gate lines and data lines;

a gate driver to supply signals corresponding to the gate lines of the display panel; and a data driver to supply an image data to the data lines of the display panel, wherein the gate driver includes a plurality of shift registers configured to output signals sequentially such that a current shift register is reset by an output signal of the shift register after the following shift register, the plurality of shift registers including a plurality of odd-numbered shift registers and a plurality of even-numbered shift registers, wherein one of a first clock and a second clock having opposite phases is inputted to the plurality of shift registers, wherein the first clock is provided to the odd-numbered shift registers, and the second clock is provided to the even-numbered shift registers, wherein the odd-numbered shift registers are performed to the first clock and the even-numbered shift registers are performed to the second clock, wherein a start time and duration of a high output signal of each of the odd-numbered shift registers is identical with a start time and duration of high period of the first clock, wherein a start time and duration of an output signal of each of the even-numbered shift registers is identical with a start time and duration of high period of the second clock, and wherein each of the shift registers includes:

a first transistor directly coupled to an output signal of a previous shift register and a first node;

a second transistor directly coupled the output signal of a previous shift register, a second node and a first power supply voltage;

a third transistor directly coupled to the first node, the second node and the first power supply voltage;

a fourth transistor directly coupled the second node, the first node and the first power supply voltage;

a fifth transistor directly coupled the first node and one of clock signals having two or more phases;

a sixth transistor directly coupled the second node, the fifth transistor and the first power supply voltage; and a seventh transistor directly coupled to an output signal of a shift register after the following shift register, the first node and the first power supply voltage, wherein the current shift register charges a node with the output signal of the previous shift register during a first clock period, outputs an output signal of a high state from the current shift register by the charged node during a second clock period, discharges the output signal of a high state from the current shift register to a low state during a third clock period, and discharges the charged node by the output signal of the shift register after the following shift register during a fourth clock period, wherein the fifth transistor is kept in a turned on state by a voltage of the first node, and the output signal of the high state is rapidly discharged to the low state through the fifth transistor during the third clock period.

8. The gate driver according to claim 7, wherein last, second last and third last shift registers are reset by an output signal of the last shift register.

9. The gate driver according to claim 7, further including a eighth transistor coupled to the second power supply voltage and the second node.

10. The display device according to claim 7, wherein an output signal of the current shift register is discharged to a low state when the output signal of the following shift register is output from the following shift register, the following shift register located between the current shift register and the shift register after the following shift register.

* * * * *